(12) United States Patent
Chang et al.

(10) Patent No.: US 11,264,374 B2
(45) Date of Patent: Mar. 1, 2022

(54) METHOD OF FORMING ELECTROSTATIC DISCHARGE (ESD) TESTING STRUCTURE

(71) Applicant: TAIWAN SEMICONDUCTOR MANUFACTURING COMPANY, LTD., Hsinchu (TW)

(72) Inventors: Tzu-Heng Chang, New Taipei (TW); Jen-Chou Tseng, Jhudong Township (TW); Ming-Hsiang Song, Shin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 16/996,410

(22) Filed: Aug. 18, 2020

(65) Prior Publication Data
US 2020/0381419 A1    Dec. 3, 2020

Related U.S. Application Data

(63) Continuation of application No. 16/442,829, filed on Jun. 17, 2019, now Pat. No. 10,756,082, which is a continuation of application No. 15/274,356, filed on Sep. 23, 2016, now Pat. No. 10,325,906.

(51) Int. Cl.
| | | |
|---|---|---|
| H01L 27/02 | (2006.01) |
| H01L 21/66 | (2006.01) |
| G01R 31/00 | (2006.01) |
| G01R 31/28 | (2006.01) |
| H01L 23/62 | (2006.01) |
| H01L 23/60 | (2006.01) |
| H01L 25/00 | (2006.01) |

(52) U.S. Cl.
CPC ........ *H01L 27/0288* (2013.01); *G01R 31/002* (2013.01); *G01R 31/2856* (2013.01); *H01L 22/14* (2013.01); *H01L 22/30* (2013.01); *H01L 22/34* (2013.01); *H01L 23/62* (2013.01); *H01L 23/60* (2013.01); *H01L 25/50* (2013.01)

(58) Field of Classification Search
CPC ..... H01L 27/0288; H01L 22/34; H01L 22/30; H01L 22/14; H01L 23/62; H01L 23/60
See application file for complete search history.

(56) References Cited

U.S. PATENT DOCUMENTS

| | | |
|---|---|---|
| 7,594,198 B2 | 9/2009 | Chen |
| 8,324,658 B2 | 12/2012 | Tsai et al. |
| 8,334,571 B2 | 12/2012 | Tsai et al. |
| 8,536,893 B2 | 9/2013 | Worley et al. |
| 8,541,848 B2 | 9/2013 | Huang et al. |
| 8,698,139 B2 | 4/2014 | Bazarjani et al. |
| 8,730,626 B2 | 5/2014 | Tseng et al. |

(Continued)

*Primary Examiner* — Dominic E Hawkins
(74) *Attorney, Agent, or Firm* — Hauptman Ham, LLP

(57) ABSTRACT

A method of making an electrostatic discharge (ESD) testing structure includes forming, in a first die, a first measurement device. The method further includes forming, in a second die, a fuse, a first trim pad, and a second trim pad. The method further includes forming, between the first die and the second die, a plurality of electrical bonds, wherein a first bond of the plurality of bonds is electrically connected to the first trim pad and a first side of the fuse, and a second bond of the plurality of bonds is electrically connected to the second trim pad and a second side of the fuse.

20 Claims, 14 Drawing Sheets

(56) References Cited

U.S. PATENT DOCUMENTS

| | | |
|---|---|---|
| 8,743,515 B2 | 6/2014 | Yang et al. |
| 8,759,871 B2 | 6/2014 | Song et al. |
| 8,760,828 B2 | 6/2014 | Ma |
| 8,792,218 B2 | 7/2014 | Tsai |
| 8,854,778 B2 | 10/2014 | Chu et al. |
| 8,867,183 B2 | 10/2014 | Chen et al. |
| 9,035,393 B2 | 5/2015 | Ma et al. |
| 9,048,655 B2 | 6/2015 | Meng et al. |
| 9,069,924 B2 | 6/2015 | Chen |
| 9,117,677 B2 | 8/2015 | Ma et al. |
| 9,184,586 B2 | 11/2015 | Wang et al. |
| 9,214,540 B2 | 12/2015 | Tsai et al. |
| 9,266,722 B2 | 2/2016 | Wissman et al. |
| 2002/0145177 A1 | 10/2002 | Takasu |
| 2004/0082083 A1 | 4/2004 | Kraz et al. |
| 2009/0039464 A1* | 2/2009 | Arai ............... H01L 23/5258 257/529 |
| 2009/0283898 A1* | 11/2009 | Janzen ............. H01L 23/525 257/698 |
| 2011/0051301 A1 | 3/2011 | Thijs et al. |
| 2013/0119433 A1 | 5/2013 | Wang |
| 2013/0193851 A1 | 8/2013 | Alon et al. |
| 2013/0257624 A1 | 10/2013 | Ayotte et al. |
| 2014/0098448 A1 | 4/2014 | Henderson |
| 2014/0175611 A1 | 6/2014 | Hsu |
| 2014/0217461 A1 | 8/2014 | Song et al. |
| 2014/0226241 A1 | 8/2014 | Tseng et al. |
| 2014/0307355 A1 | 10/2014 | Tsai et al. |
| 2016/0156176 A1* | 6/2016 | Kunz, Jr. ............ H01L 25/00 361/56 |
| 2018/0096956 A1* | 4/2018 | Li .................... H01L 27/12 |

\* cited by examiner

METHOD OF FORMING ELECTROSTATIC DISCHARGE (ESD) TESTING STRUCTURE

PRIORITY CLAIM

The present application is a continuation of U.S. application Ser. No. 16/442,829, filed Jun. 17, 2019, which is a continuation of U.S. application Ser. No. 15/274,356, filed Sep. 23, 2016, the entire contents of which are incorporated herein by reference.

BACKGROUND

Electrostatic discharge (ESD) events occur when a large amount of electrical charge is discharged in a short amount of time. ESD events potentially damage active devices, passive devices and other structures within integrated circuits (ICs) due to high voltage or high current of the ESD event.

External testing devices are usable to measure ESD events. External testing devices are connected to ICs at probe pads in order to measure the current or voltage of the ESD event, in some instances. In some instances, the external testing device remotely measures the ESD event in order to avoid contact with the IC during the ESD event.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
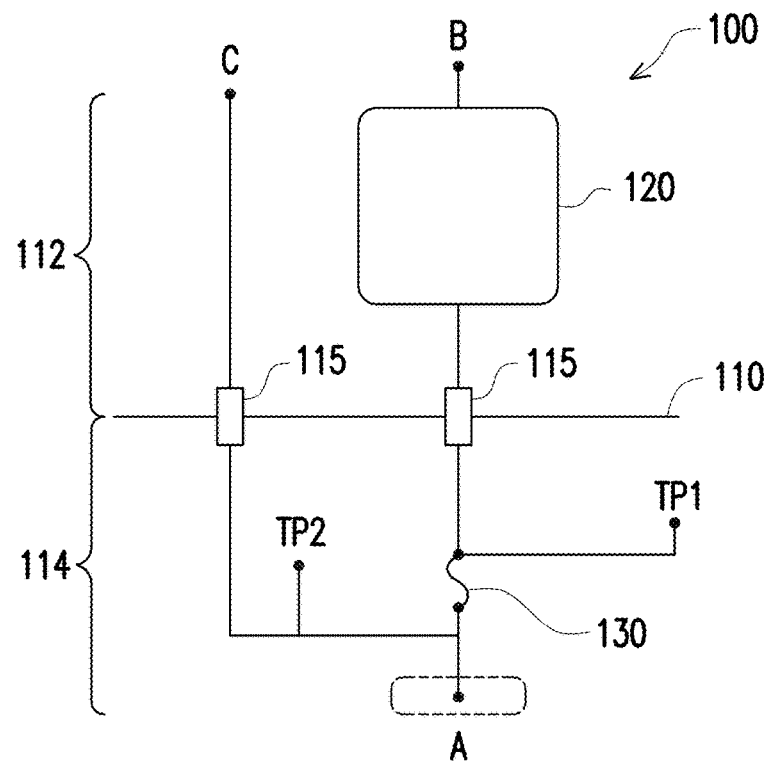
FIG. 1 is a schematic view of an electrostatic discharge (ESD) testing structure in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, semiconductor manufacturing processes cause charges to build up on elements undergoing processing. Processes like grinding/planarizing, sawing/dicing or cleaning cause charges to build up on the elements during processing. A magnitude and location of the charge build up depends on numerous factors including materials used during processing, processing rate and environmental conditions.

As device sizes decrease, integrated circuit (IC) formation uses three-dimensional integrated circuits (3DIC) or 2.5-dimensional integrated circuits (2.5DIC) in order to form devices which have a same functional ability in less area on a substrate. 3DIC and 2.5DIC include bonding one die onto another element, such as a substrate, an interposer, a fan out structure, another die, or another suitable element. During a bonding process, such as a flip chip bonding process, elements are electrically bonded together to permit signals to travel between the die and the other element. In some instances, the built-up charges are released during the bonding process resulting in an electrostatic discharge (ESD) event. These ESD events are potentially damaging to elements being bonded together. For example, a surge of current or voltage damages transistors or other devices, in some instances. External testing devices are limited in the ability to precisely determine a location and/or magnitude of ESD events.

Precise determination of a location and magnitude of the ESD events helps to increase production yield by avoiding loss of product during the bonding process. In addition, the information about the location and magnitude of the ESD events is usable to feed back into the manufacturing process in order to identify portions of the process which impart a significant amount of charge build up in order to attempt to reduce the amount of charge build up. In addition to modifying processes, the ESD event information is usable to determine whether any additional protection structures are feasible. The ESD event information is also usable to determine whether environmental controls are sufficient for a certain process.

An ESD testing structure formed as part of the elements undergoing the bonding process helps to precisely determine locations and magnitudes of ESD events. In some embodiments, an array of ESD testing structures is formed across a die in order to determine both magnitude and location of ESD events. By forming the testing structures directly on the die, the ESD testing structures are able to measure current and/or voltage at the site where the discharge occurs. This provides more precise data collection than a remote measurement by an external device or a measurement following completion of a bonding process. The ESD testing structures are also capable of being formed as part of a protection structure to help reduce the risk of damage to a victim device during a bonding process. A victim device is a device to be protected from the ESD event.

The ESD testing structures are able to measure either voltage or current and the type of measurement is selectable based on a desire of a user. In addition, the ESD testing structures are designed to be able to determine the type of charge build up, i.e., positive charge or negative charge, in some embodiments. This information is usable to help improve a semiconductor manufacturing process in order to improve yield.

FIG. 1 is a schematic view of an ESD testing structure 100 in accordance with some embodiments. ESD testing structure 100 is located at an interface 110 between a top die 112 and a bottom die 114. Bonds 115 provide an electrical connection between top die 112 and bottom die 114. A measurement device 120, located in top die 112, is connected to one of bonds 115 in order to measure the voltage or current of an ESD event. A fuse 130 is connected to measurement device 120 through bond 115. Fuse 130 is capable of being selectively blown to prevent measurement device 120 from being usable during a bonding process. ESD testing structure 100 further includes probe pad A which is configured to be connected to ground; probe pad B which is usable to obtain information related to measurement device 120 following a bonding process; and probe pad C which is usable to test for an open circuit following the bonding process. Probe pad A is located on an opposite side of fuse 130 from measurement device 120. Probe pad B is located on an opposite side of measurement device 120 from fuse 130. Probe pad C is connected to probe pad A through a bond 115 which bypasses fuse 130. ESD testing structure 100 also includes trimming pad TP1 and trimming pad TP2. Trimming pads TP1 and TP2 are usable to blow fuse 130 prior to the bonding process. Trimming pad TP1 is connected to a first side of fuse 130 between the fuse and a first bond 115. Trimming pad TP2 is connected to a second side of fuse 130 between probe pad A and a second bond 115.

Interface 110 is a location where top die 112 and bottom die 114 meet. In some embodiments, a standoff distance exists between top die 112 and bottom die 114 such that the top die does not typically contact the bottom die. In some embodiments, at least one of top die 112 or bottom die 114 is replaced by a substrate, an interposer, a fan out structure or another suitable element.

During manufacturing of top die 112 or bottom die 114, charges build up within the top die or bottom die or along a surface of the top die or bottom die. When the electrically conductive elements of bonds 115 come into contact, the built-up charges are able to move from one die to the other along the conductive path formed by bonds 115. This movement of charges is an ESD event.

Bonds 115 are electrical connections between top die 112 and bottom die 114. In some embodiments, bonds 115 include copper pillars; solder bumps, conductive traces or other suitable electrical connection components. In some embodiments, bonds 115 are located completely between top die 112 and bottom die 114. In some embodiments, bonds 115 prevent top die 112 from physically contacting bottom die 114 in order to create the standoff height between the top die and the bottom die. In some embodiments, bonds 115 are formed by a reflow process, a eutectic bonding process, or another suitable bonding process. In some embodiments where top die 112 physically contacts bottom die 114, a fusion bonding process is used to form bonds 115 and to bond the top die to the bottom die.

Measurement device 120 is configured to measure either a voltage during an ESD event or a current during the ESD event. Measurement device 120 is formed during the formation of other components of top die 112, such as a functional device, dummy device or other components. By forming measurement device 120 during formation of other components of top die 112, measurement device 120 has a same process corner as the other components of the top die, i.e., manufacturing variation across a wafer used to form top die 112 is the same for measurement device 120 and the other components. Having a same process corner will help with precisely measuring an impact of the ESD event on the components in top die 112.

In some embodiments, measurement device 120 includes a transistor, such as a metal-oxide-semiconductor (MOS) transistor, configured as a capacitor. In some embodiments, measurement device 120 includes a diode connected transistor. In some embodiments, measurement device 120 includes a plurality of diodes connected in series and/or in parallel. In some embodiments, measurement device 120 includes an array of resistors and fuses.

Fuse 130 is usable to disable measurement device 120 prior to the bonding process. Fuse 130 is configured to form an open circuit, i.e., be blown, if a current across the fuse exceeds a threshold value. The threshold value for fuse 130 is higher than a current which will destroy measurement device 120 in order to ensure that fuse 130 remains intact during the ESD event measured by the measurement device. In some embodiments, the threshold value ranges from about 10 milliamps (mA) to about 20 mA. If the threshold value is too low, a risk of unintentionally blowing fuse 130 increases, in some instances. If the threshold value is too high, an amount of power for blowing fuse 130 increases and a risk of damage to surrounding components in bottom die 114 increases, in some embodiments.

Blowing fuse 130 is useful for omitting measurement device 120 for determining a location of the ESD event. In addition, blowing fuse 130 permits selectively disabling measurement device 120 based on a type of measurement performed by the measurement device. For example, if devices within top die 112 or bottom die 114 are more susceptible to damage by high currents instead of by high voltages, fuses 130 associated with measurement devices 120 which measure voltage are blown, in some embodiments.

Fuse 130 includes a conductive component. In some embodiments, fuse 130 includes a metallic material, silicide, a conductive polymer or another suitable conductive material. In some embodiments, fuse 130 is located in an interconnect structure of bottom die 114. In some embodiments, fuse 130 is in a first metal level of bottom die 114. In some embodiments, fuse 130 is a conductive line element. In some embodiments, fuse 130 is a conductive via element.

Probe pad A is usable for connecting ESD testing structure 100 to ground in order to determine whether measurement device 120 or fuse 130 was damaged during the ESD event. Probe pad A is located on a surface of bottom die 114 separated from top die 112. In some embodiments, probe pad A is located on a surface of bottom die 114 opposite from top die 112. In some embodiments, probe pad A is located on a same surface of bottom die 114 as top die 112 and is displaced from top die 112 in a direction parallel to interface 110. In some embodiments, a passivation layer is formed over probe pad A following the bonding process in order to reduce the risk of oxidation of probe pad A.

Probe pad B is usable for retrieving information measured by measurement device 120 following the ESD event.

Probe pad C is usable for determining whether there is an open circuit following the bonding process. By probing probe pad C and probe pad A, the electrical connection through bond 115 is tested in order to determine whether any open circuit measured by testing at probe pad B is the result of damage to measurement device 120/fuse 130 or by a poor bonding process. Probe pads B and C are independently located on a surface of top die 112 separated from bottom die 114. In some embodiments, probe pads B and C are independently located on a surface of top die 112 opposite from bottom die 114. In some embodiments, probe pads B and C are independently located on a same surface of top die 112 as bottom die 114 and is displaced from bottom die 114 in a direction parallel to interface 110. In some embodiments, probe pad C is on a same surface of top die 112 as probe pad B. In some embodiments, probe pad C is on a different surface of top die 112 from probe pad B. In some embodiments, a passivation layer is formed over probe pad C following the bonding process in order to reduce the risk of oxidation of probe pad C.

Trimming pad TP1 and trimming pad TP2 are usable to blow fuse 130 prior to the bonding process. Trimming pad TP1 or trimming pad TP2 are located between bottom die 114 and top die 112, in some embodiments. In some embodiments, trimming pad TP1 or trimming pad TP2 is separated from top die 112. In some embodiments, at least one of trimming pad TP1 or trimming pad TP2 is located on a same surface of bottom die 114 as probe pad A. In some embodiments, at least one of trimming pad TP1 or trimming pad TP2 is located on a surface of bottom die 114 different from probe pad A. In some embodiments, at least one of trimming pad TP1 or trimming pad TP2 is covered by a passivation layer before or after the bonding process to reduce the risk of oxidation.

Prior to the bonding process, a fuse 130 of selected ESD testing structures is blown by applying a current from trimming pad TP1 to trimming pad TP2 of the selected ESD testing structures. In some embodiments, the ESD testing structures are selected based on a type of electrical property to be measured. For example, if only current of the ESD event is to be measured, fuse 130 for voltage measuring ESD testing structures is blown. In some embodiments, the ESD testing structures are selected based on a direction of the discharge of the ESD event. For example, if ESD testing structures which test a current flow from top die 112 to bottom die 114 are used, fuses 130 of ESD testing structures which prohibit flow in this direction are blown. In some embodiments, the ESD testing structures are selected based on location. For example, fuses 130 of ESD testing structures outside of a selected area of bottom die 114 are blown.

In use, ESD testing structure 100 measures the current or voltage discharged between top die 112 and bottom die 114 during the bonding process using measurement device 120. For example, in some embodiments where measurement device 120 includes a capacitor, testing at probe pad A and probe pad B will determine the amount of voltage stored in the capacitor. In some embodiments where measurement device 120 includes an array of resistors and fuses, probing at probe pad A and probe pad B to determine a resistance between the two probe pads will determine a number of the fuses the ESD event blew in order to determine a current of the ESD event. Using diodes as the resistors is also able to determine a direction of the current flow in order to help determine the type of charge built up on each of top die 112 and bottom die 114. Other measurement device 120 structures will provide information on current or voltage in different ways.

ESD testing structure 100 is closer to the actual location where the charge release occurs and therefore is able to better determine the severity of the ESD event in comparison with external measurement devices. EST testing structure 100 also provides a significant amount of flexibility in determining whether to disable measurement device 120 in comparison with other structures which do not include fuse 130.

Figure 2:
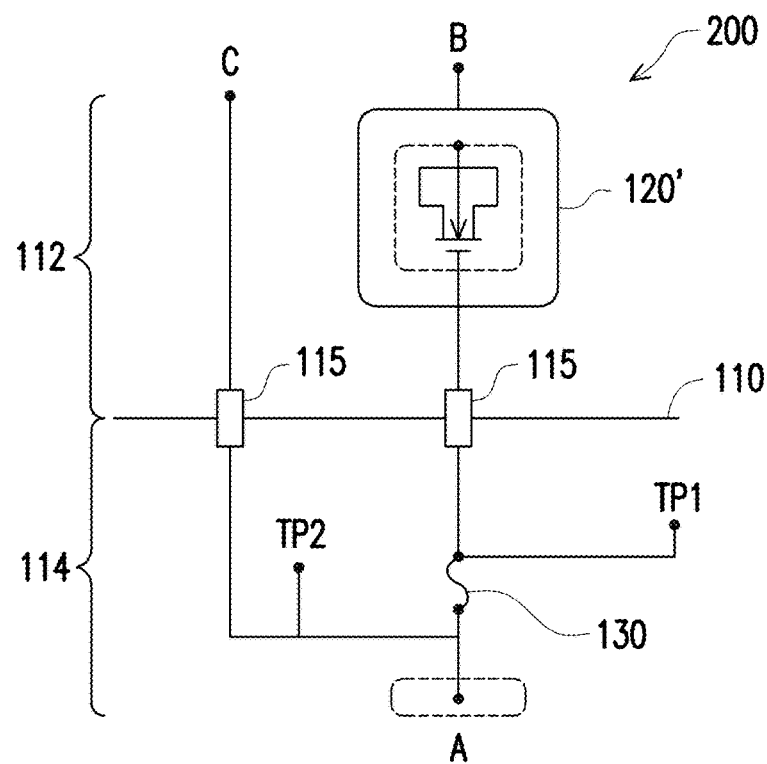
FIG. 2 is a schematic view of an ESD testing structure in accordance with some embodiments.

FIG. 2 is a schematic view of an ESD testing structure 200 in accordance with some embodiments. ESD testing structure 200 is similar to ESD testing structure 100. In comparison with ESD testing structure 100, ESD testing structure 200 includes measurement device 120' in place of measurement device 120. ESD testing structure 200 is configured to measure a voltage of the ESD event. Measurement device 120' is a MOS transistor configured as a capacitor.

During the ESD event, a voltage is stored in the capacitor of measurement device 120'. By testing probe pads A, B and C, the voltage stored in the capacitor is retrieved for analysis. In some instances, a voltage of the ESD event exceeds a breakdown voltage of measurement device 120'. Testing at probe pads A, B and C will indicate that measurement device 120' no longer functions as a capacitor and permits current to flow freely from probe pad B to probe pad A. While this information indicates that the ESD event exceeded a certain value, the actual voltage value of the ESD event is not measured. In some embodiments, an array of capacitors connected in parallel, where each capacitor has a different breakdown voltage is included in measurement device 120' in order to assist in determining the voltage level of the ESD event when voltage level exceeds a breakdown voltage of one of the capacitors. For example, in an ESD testing structure 200 including two capacitors having different breakdown voltages, if one of the capacitors is destroyed; and the other remains intact, the ESD event is determined to have a voltage level between the two breakdown voltages of the capacitors.

Figure 3:
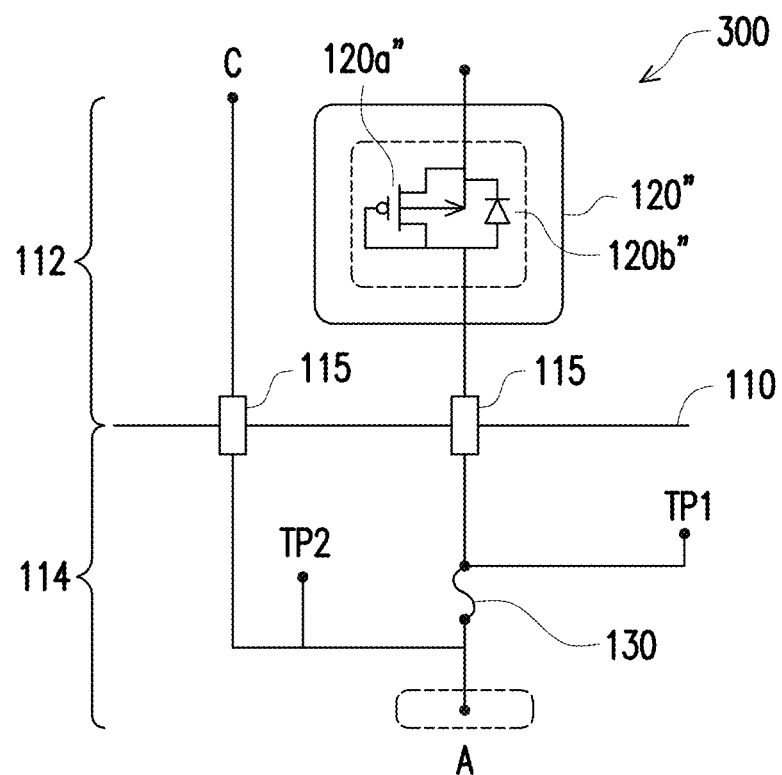
FIG. 3 is a schematic view of an ESD testing structure in accordance with some embodiments.

FIG. 3 is a schematic view of an ESD testing structure 300 in accordance with some embodiments. ESD testing structure 300 is similar to ESD testing structure 100. In comparison with ESD testing structure 100, ESD testing structure 300 includes measurement device 120" in place of measurement device 120. ESD testing structure 300 is configured to measure a current of the ESD event. Measurement device 120" is a diode-connected MOS transistor. Measurement device 120" includes a PMOS diode 120a" for permitting current flow from top die 112 to bottom die 114; and a second diode 120b" for permitting current flow from bottom die 114 to top die 112.

Measurement device 120" is usable in combination with a current recording structure to determine a magnitude of a current during the ESD event. In some embodiments, the current recording structure is between measurement device 120" and probe pad B. In some embodiments, the current recording structure is between measurement device 120" and bond 115. In some embodiments, the current recording structure includes an array of resistors and fuses.

Figure 4:
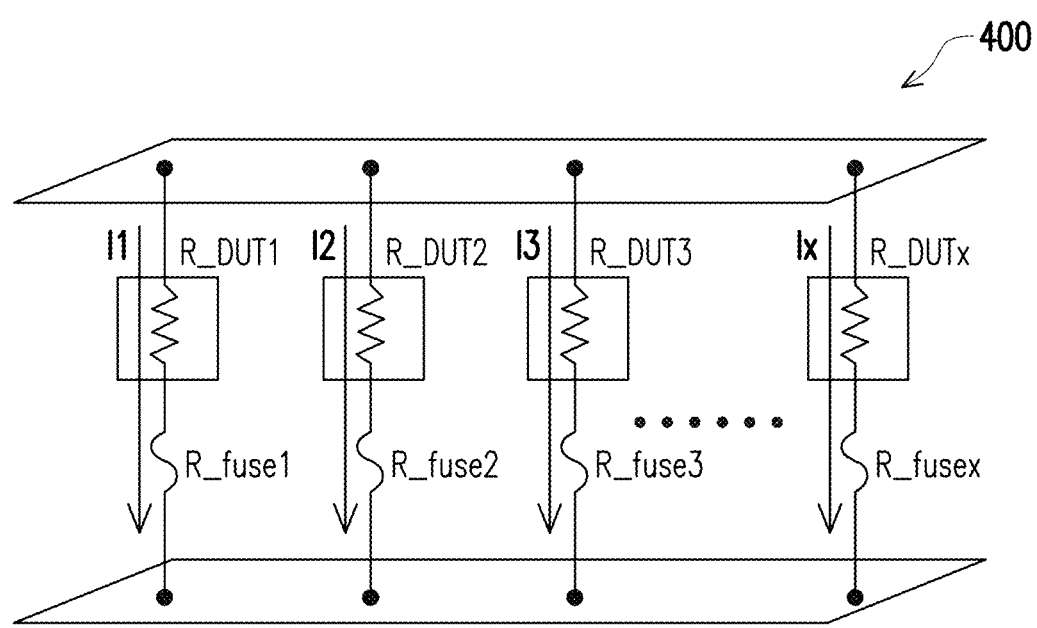
FIG. 4 is a schematic view of a current recording structure for an ESD testing structure in accordance with some embodiments.

FIG. 4 is a schematic view of a current recording structure 400 for an ESD testing structure in accordance with some embodiments. Current recording structure 400 is usable with an ESD testing structure for storing information related to a current of an ESD event. Current recording structure 400 is usable in combination with a measurement device, such as measurement device 120 (FIG. 1) or measurement device 120" (FIG. 3). In some embodiments, current recording structure 400 replaces the measurement device, e.g., measurement device 120, measurement device 120' or measurement device 120".

Current recording structure 400 includes an array of resistors R_DUT1, R_DUT2, R_DUT3 . . . R_DUTx (collectively referred to as resistors R_DUT). Resistors R_DUT are connected in parallel. Current recording structure 400 also includes an array of fuses R_fuse1, R_fuse1, R_fuse3 . . . R_fusex (collectively referred to as fuses R_fuse). Each resistor of resistors R_DUT is connected in series with a corresponding fuse of fuses R_fuse. Each combination of resistor R_DUT and fuse R_fuse creates a specific current, e.g., current I1, I2, I3 . . . Ix, based on the resistance value of the respective resistor and fuse and a voltage of the ESD event. Selecting a resistance of resistors R_DUT and threshold values for fuses R_fuse, a precise measurement of a current of the ESD event is recorded in current recording structure 400.

Fuses R_fuse have a resistance value and generate heat based on the resistance value. Once the heat exceeds the threshold value, the fuse breaks, i.e., is blown, and the electrical connection provided by the fuse is open. The threshold value of fuses R_fuse is independently selected during a manufacturing process. In some embodiments, the threshold value is selected based on a material of fuses R_fuse; geometrical dimensions of fuses R_fuse; connections to fuses R_fuse; or other suitable selections. Fuses R_fuse independently have a threshold value ranging from about 8 mA to about 20 mA. If the threshold value is too low, a risk of blowing a fuse prior to the ESD event increases, in some instances. If the threshold value is too high, a risk of not recording any current for the ESD event increases, in some instances. The maximum threshold value for fuses R_fuse is less than the threshold value for fuse 130 of an ESD testing structure, e.g., ESD testing structure 100 or ESD testing structure 120". If the maximum threshold value for fuses R_fuse exceeds the threshold value for fuse 130, a risk of blowing fuse 130 instead of fuses in current recording structure 400 increases, in some instances. In some embodiments, each of fuses R_fuse has a same threshold value. In some embodiments, at least one fuse of fuses R_fuse has a different threshold value from another fuse of fuses R_fuse.

Fuses R_fuse are formed in an interconnect structure of an ESD testing structure. In some embodiments, each of fuses R_fuse is formed on a same level of an interconnect structure. In some embodiments, at least one fuse of fuses R_fuse is formed on a different level of an interconnect structure from another fuse of fuses R_fuse. In some embodiments, each of fuses R_fuse is formed on a same level of an interconnect structure as fuse 130. In some embodiments, at least one fuse of fuses R_fuse is formed on a different level of an interconnect structure from fuse 130.

Resistors R_DUT are formed in an interconnect structure of the ESD testing structure or in a front-end, i.e., within a substrate, of the ESD testing structure. In some embodiments, each resistor of resistors R_DUT is formed in the front-end of the ESD testing structure. In some embodiments, each resistor of resistors R_DUT is formed in the interconnect structure of the ESD testing structure. In some embodiments, at least one resistor of resistors R_DUT is formed in the front-end and another resistor of resistors R_DUT is formed in the interconnect structure. In some embodiments, each of resistors R_DUT is formed on a same level of the interconnect structure. In some embodiments, at least one resistor of resistors R_DUT is formed on a different level of the interconnect structure from another resistor of resistors R_DUT. In some embodiments, each of resistors R_DUT is formed on a same level of an interconnect structure as fuse 130. In some embodiments, at least one resistor of resistors R_DUT is formed on a different level of an interconnect structure from fuse 130.

A resistance of each of resistors R_DUT is selected during the manufacturing process. The resistance of each of resistors R_DUT is independently selected based on a material and/or geometric dimension of resistors R_DUT. In some embodiments, each of resistors R_DUT has a same resistance. In some embodiments, at least one resistor of resistors R_DUT has a different resistance from another resistor of resistors R_DUT.

A combination of a resistor, e.g., R_DUT1, and a fuse, e.g., R_fuse1, determines a current, e.g., I1, passing along a leg of current recording structure 400. Each leg of current recording structure 400 is configured to have a different current value. In some embodiments, the current value along each leg is selected by changing the resistance of resistors R_DUT, as discussed above. For example, in some embodiments, a resistance imparted by each of fuses R_fuse is constant across current recording structure 400 and the resistance of each of resistors R_DUT is different from each other resistor. In some embodiments, the current value along each leg is selected by changing the resistance imparted by fuses R_fuse. For example, in some embodiments, a resistance imparted by each of fuses R_fuse is different from every other fuse and the resistance of each of resistors R_DUT is constant across current recording structure 400. In some embodiments, the resistance is selected by changing the resistance of resistor R_DUT and the resistance imparted by fuses R_fuse. For example, in some embodiments, the resistance of resistor R_DUT1 is equal to the resistance of resistor R_DUT2, but the resistance imparted by fuse R_fuse1 is different from the resistance imparted by fuse R_fuse1; and the resistance of resistor R_DUT3 is different from the resistance of resistor R_DUT1 or R_DUT2, but the resistance imparted by fuse R_fuse3 is a same resistance as fuse R_fuse1 or R_fuse1.

In operation, current recording structure 400 carries a current across each leg based on the combined resistance of resistors R_DUT and fuses R_fuse. The current value is determined based on the materials and geometric dimensions of resistors R_DUT and fuses R_fuse. As the current magnitude of the ESD event increases, a number of blown fuses of current recording structures 400 increases. Probing an ESD testing structure, e.g., ESD testing structure 100 or ESD testing structure 300, permits a determination of which fuses of current recording structure 400 are blown based on a measured voltage drop from probe pad B to probe pad A and the known resistances of legs of the current recording structure 400.

Identifying which fuses R_fuse are blown determines a range of the current magnitude of the ESD event. The range is from the highest threshold value of the blown fuses to the lowest threshold value of the non-blown fuses. The scale of the range depends on a number of fuses in current recording structure 400. As the number of fuses increases, the gradations of the range between threshold values of fuses decreases; but a size of current recording structure 400 increases. If the ESD event fails to blow any of fuses R_fuse, then the current of the ESD event is determined to be less than a smallest recordable current of current recording structure 400.

Using ESD testing structure 300 as an example, in some embodiments, current recording structure 400 is connected between measurement device 120" and probe pad B. In some embodiments, current recording structure 400 is connected between measurement device 120" and bond 115. In some embodiments, current recording structure is connected between bond 115 and fuse 130. In some embodiments, current recording structure 400 replaces the measurement device, e.g., measurement device 120, measurement device 120' or measurement device 120".

Figure 5A:
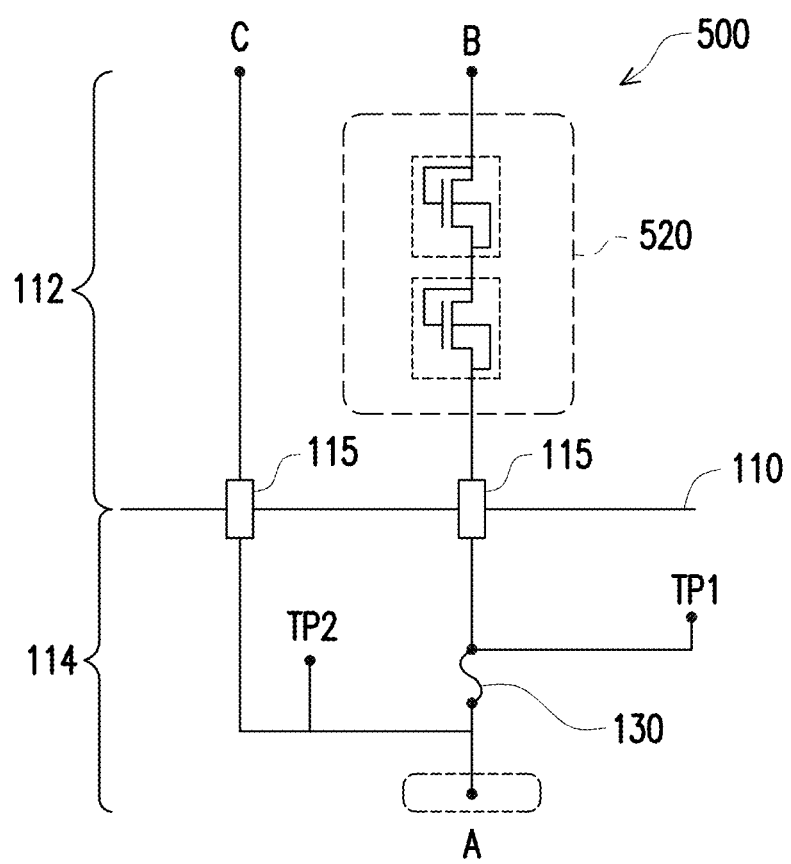
FIGS. 5A-5C are schematic views of ESD testing structures in accordance with some embodiments.

FIG. 5A is a schematic view of an ESD testing structure 500 in accordance with some embodiments. ESD testing structure 500 is similar to ESD testing structure 300. In comparison with ESD testing structure 300, ESD testing structure 500 includes measurement device 520 in place of measurement device 120". Measurement device 520 includes two series-connected NMOS diodes. In some embodiments, measurement device 520 includes greater or fewer number of series-connected NMOS diodes. NMOS diodes restrict a direction of current flow in ESD testing structure 500. If the ESD event discharges current in a direction not permitted by ESD testing structure 500, a current recording structure within measurement device 520, e.g., current recording structure 400 included as part of measurement device 520, in ESD testing structure 500 will not include any blown fuses. By determining a direction of discharge in the ESD event, ESD structure provides information regarding what type of charge is built up on top die 112 and bottom die 114.

Figure 5B:
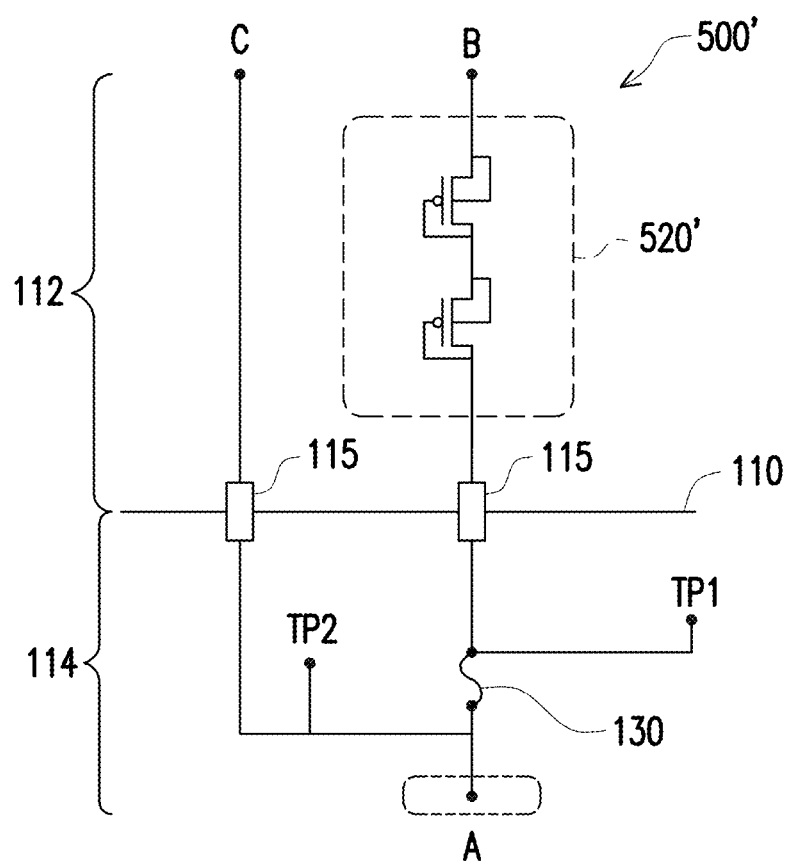

FIG. 5B is a schematic view of an ESD testing structure 500' in accordance with some embodiments. In comparison with ESD testing structure 500, ESD testing structure 500' includes measurement device 520' in place of measurement device 520, which includes two series-connected PMOS diodes. In some embodiments, measurement device 520' includes greater or fewer number of series-connected PMOS diodes. PMOS diodes restrict a direction of current flow in ESD testing structure 500' to be opposite of a current flow direction permitted by ESD testing structure 500. In some embodiments, ESD testing structures include a combination of ESD testing structure 500 and ESD testing structure 500' in order to obtain information related to both a direction and magnitude of a discharge during the ESD event.

Figure 5C:
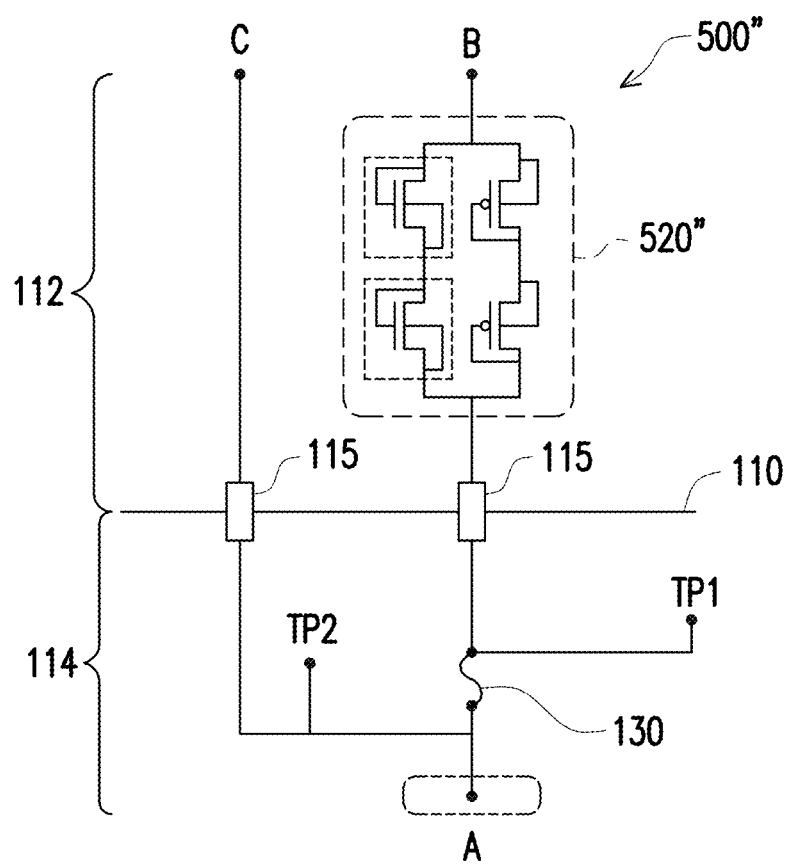

FIG. 5C is a schematic view of an ESD testing structure 500" in accordance with some embodiments. In comparison with ESD testing structure 500, ESD testing structure 500" includes measurement device 520" in place of measurement device 520, which includes two series-connected NMOS diodes connected in parallel with two other series-connected PMOS diodes. In some embodiments, separate current recording structures, e.g., multiple current recording structures 400 included as part of measurement device 520", are connected between diodes of the PMOS diodes and between diodes of the NMOS diodes. In some embodiments, measurement device 520" includes greater or fewer number of series-connected PMOS diodes or series-connected NMOS diodes and greater or fewer number of diode arrangements connected in parallel. This type of arrangement reduces an area of a device which includes two separate ESD testing structures, e.g., ESD testing structure 500 and ESD testing structure 500'. In some embodiments, a single current recording structure is connected to both the PMOS diodes and the NMOS didoes when a direction of the discharge of the ESD event is not measured by ESD testing structure 500".

Figure 6A:
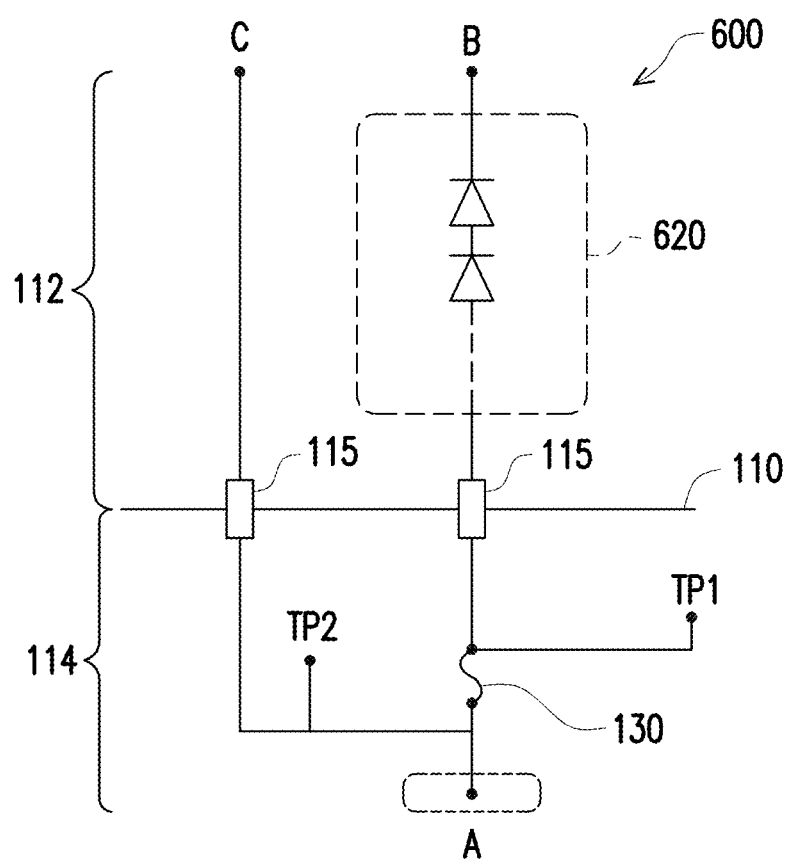
FIGS. 6A-6C are schematic view of ESD testing structures in accordance with some embodiments.

FIG. 6A is a schematic view of an ESD testing structure 600 in accordance with some embodiments. ESD testing structure 600 is similar to ESD testing structure 300. In comparison with ESD testing structure 300, ESD testing structure 600 includes measurement device 620 in place of measurement device 120". Measurement device 620 includes two series-connected of diodes for restricting a direction of current flow in ESD testing structure 600. In some embodiments, measurement device 620 includes greater or fewer number of series-connected diodes. In comparison with measurement device 520, measurement device 620 is not limited to a MOS transistor structure.

Figure 6B:
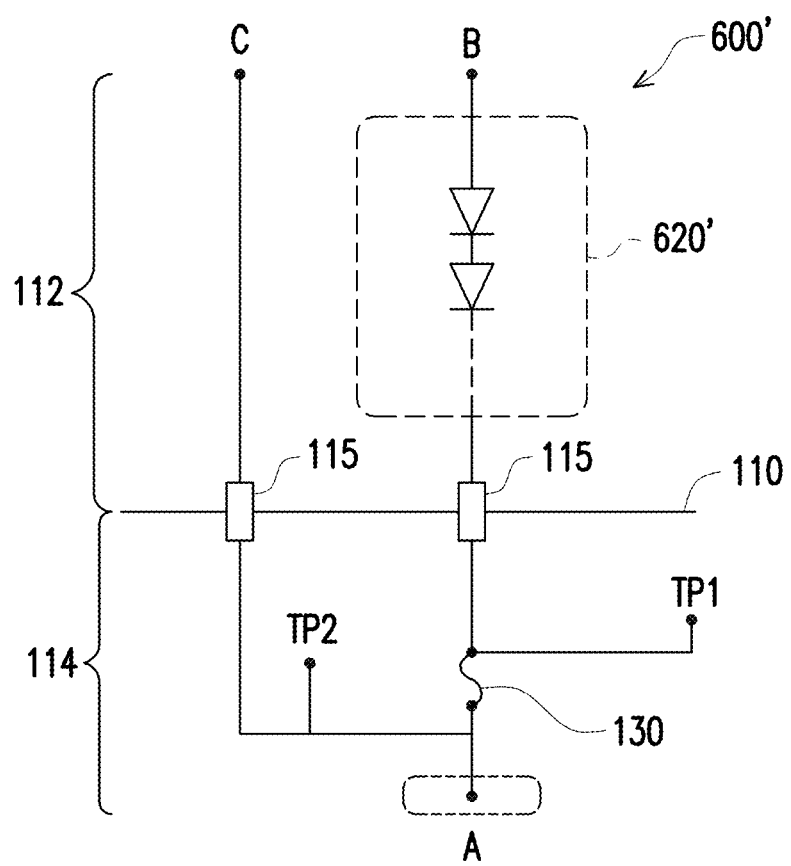

FIG. 6B is a schematic view of an ESD testing structure 600' in accordance with some embodiments. In comparison with ESD testing structure 600, ESD testing structure 600' includes measurement device 620' in place of measurement device 620, which includes two series-connected diodes for restriction a direction of current flow in ESD testing structure 600' to be opposite of a current flow direction permitted by ESD testing structure 600. In some embodiments, measurement device 620' includes greater or fewer number of series-connected diodes. In some embodiments, ESD testing structures include a combination of ESD testing structure 600 and ESD testing structure 600' in order to obtain information related to both a direction and magnitude of a discharge during the ESD event.

Figure 6C:
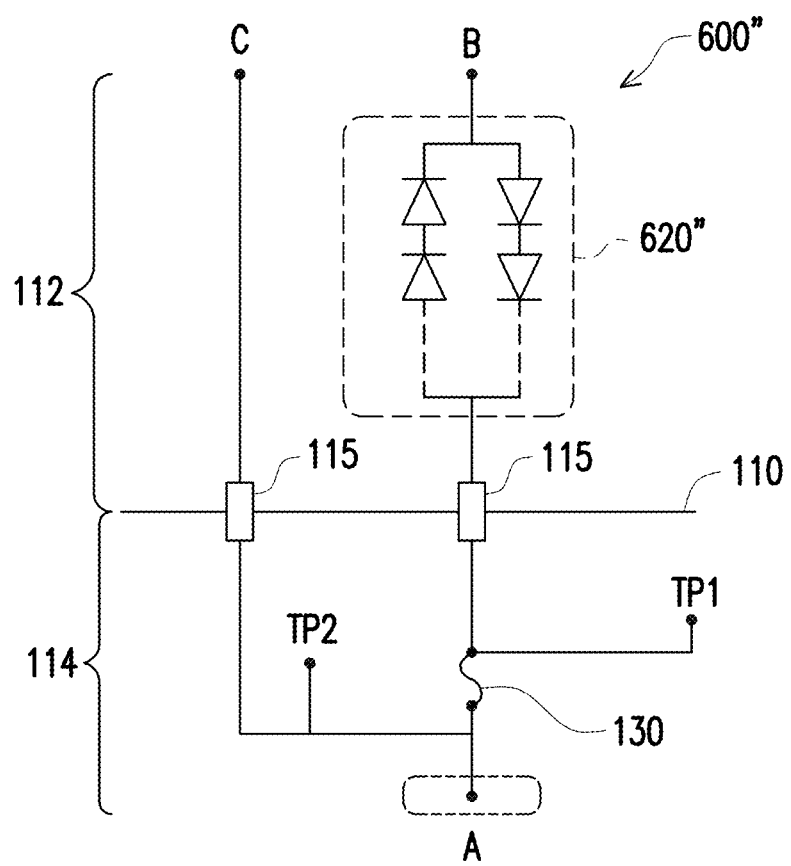

FIG. 6C is a schematic view of an ESD testing structure 600" in accordance with some embodiments. In comparison with ESD testing structure 600, ESD testing structure 600" includes measurement device 620" in place of measurement device 620, which includes two series-connected diodes connected in parallel with another two series-connected diodes. The first two series-connected diodes permits current flow in a first direction and the second two series-connected diodes permits current flow in a second direction opposite the first direction. In some embodiments, measurement device 620" includes greater or fewer number of the first series-connected diodes or the second series-connected diodes and greater or fewer number of diode arrangements connected in parallel. In some embodiments, separate current recording structures, e.g., multiple current recording structures 400 included as part of measurement device 620", are connected between diodes of the first series diodes and between diodes of the second series diodes. This type of arrangement reduces an area of a device which includes two separate ESD testing structures, e.g., ESD testing structure 600 and ESD testing structure 600'. In some embodiments, a single current recording structure is connected to both the first series diodes and the second series didoes when a direction of the discharge of the ESD event is not measured by ESD testing structure 600".

Figure 7:
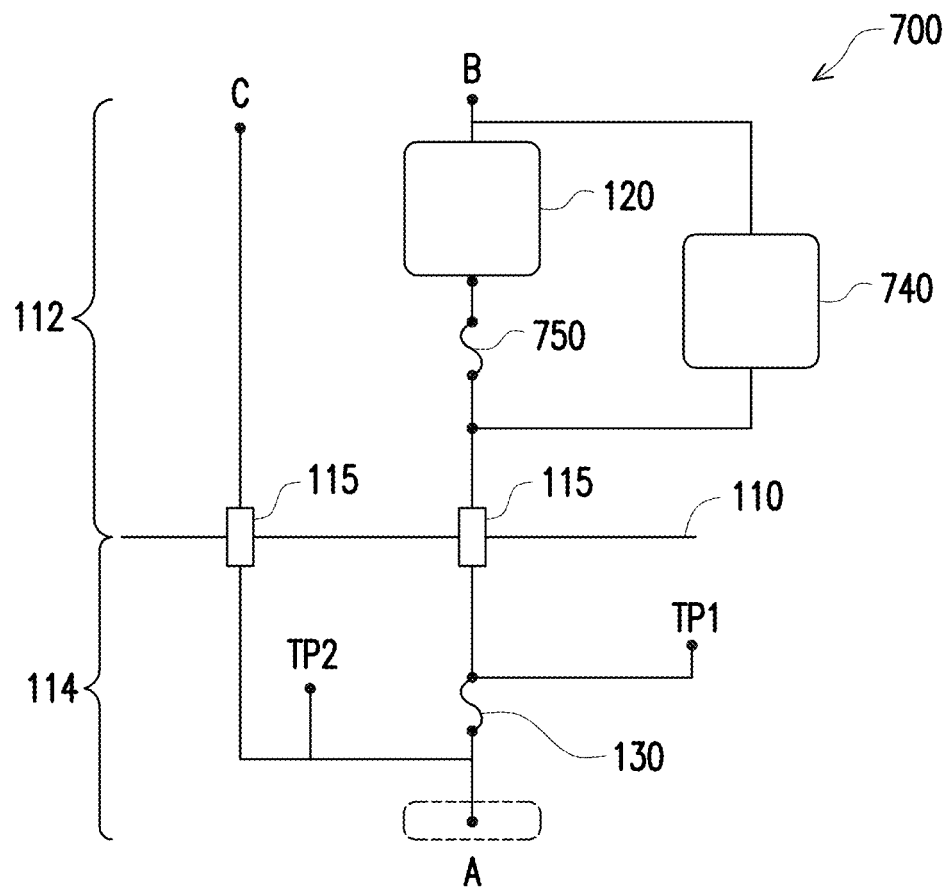
FIG. 7 is a schematic view of an ESD testing/protection structure in accordance with some embodiments.

FIG. 7 is a schematic view of an ESD testing/protection structure 700 in accordance with some embodiments. ESD testing/protection structure 700 is similar to ESD testing structure 100. In comparison with ESD testing structure 100, ESD testing structure 700 includes a victim device 740 connected in parallel with measurement device 120. A fuse 750 is connected between measurement device 120 and victim device 740. Instead of only measuring the discharge of the ESD event, ESD testing/protection structure 700 also provides protection for victim device 740.

For example, in some embodiments where measurement device 120 is configured to measure a voltage, a breakdown voltage of measurement device 120 is lower than a damaging voltage level for victim device 740. This means that measurement device 120 will create a low resistance path for the ESD event and reduce the risk of damage to victim device 740.

Fuse 750 permits disabling of measurement device 120 following the bonding process. By disabling measurement device 120 following the bonding process, parasitic properties associated with measurement device 120 which could potentially impact the functionality of victim device 740 are removed. Fuse 750 is blown by applying a sufficient voltage to probe pad B and connecting probe pad A to ground.

Figure 8:
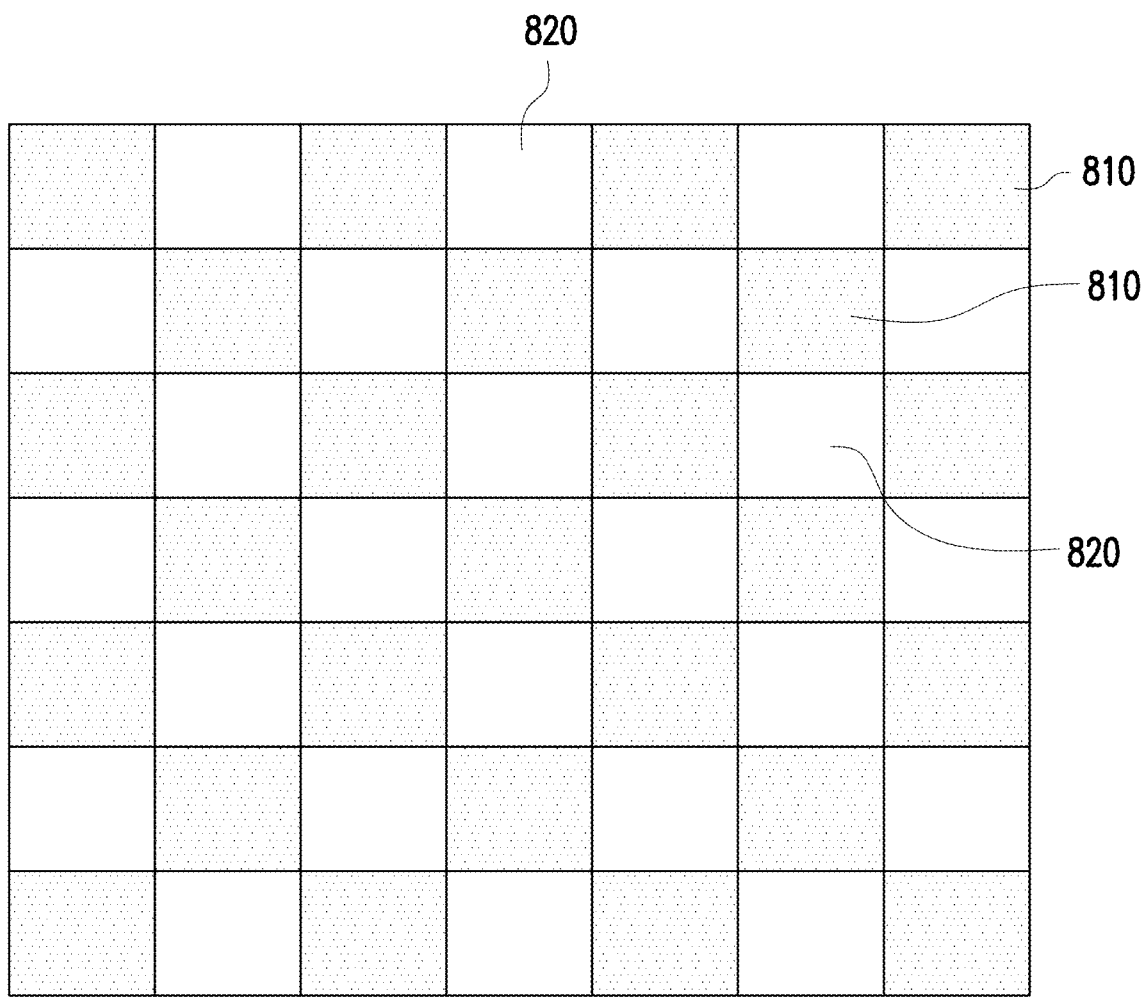
FIG. 8 is a plan view of an ESD testing array in accordance with some embodiments.

FIG. 8 is a plan view of an ESD testing array 800 in accordance with some embodiments. ESD testing array 800 is part of a die, e.g., top die 112. ESD testing array 800 includes a plurality of current measuring ESD testing structures 810, e.g., ESD testing structure 300, and a plurality of voltage measuring ESD testing structures 820, e.g., ESD testing structure 200. Including current measuring ESD testing structures 810 and voltage measuring ESD testing structures 820 helps to identify whether an ESD event is a localized discharge or whether the discharge is uniform across the die.

In some embodiments, locations for current measuring ESD testing structures 810 are determined based on empirical data. In some embodiments, locations for current measuring ESD testing structures 810 are based on a location of highly sensitive components of the die. In some embodiments, locations for current measuring ESD testing structures 810 are random. In some embodiments, locations for current measuring ESD testing structures 810 are based on a predetermined pattern. Similarly, locations for voltage measuring ESD testing structures 820 are based on empirical data, location of highly sensitive components, random placement or predetermined patterns, in some embodiments.

ESD testing array 800 does not include current measuring ESD testing structures 810 adjacent to each other along a row or column of the array. In some embodiments, current measuring ESD testing structures 810 are located adjacent to each other along a row or column of the array. In some embodiments, a number of current measuring ESD testing structures 810 and voltage measuring ESD testing structures 820 in ESD testing array 800 is based on an amount of available space on the die. For example, after locations of functional components of the die are selected, current measuring ESD testing structures 810 and voltage measuring ESD testing structures 820 are added into available locations in order. In some instances, adding current measuring ESD testing structures 810 and voltage measuring ESD testing structures 820 into available space helps to increase uniformity of a manufacturing process by smoothing out differences in pattern densities.

Figure 9A:
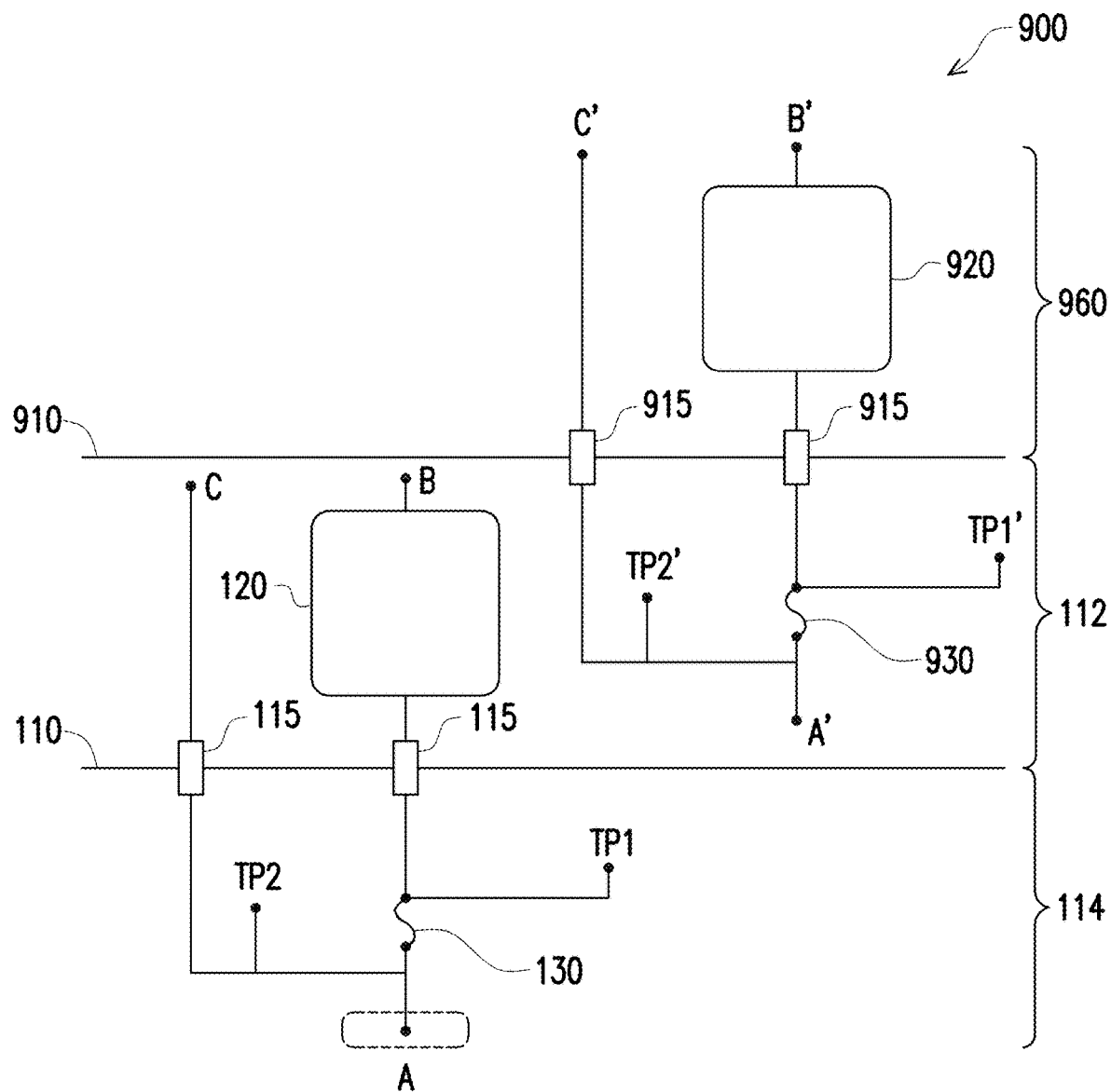
FIGS. 9A and 9B are cross-sectional view of ESD testing structures in accordance with some embodiments.

FIG. 9A is a cross-sectional view of an ESD testing structure 900 in accordance with some embodiments. ESD testing structure 900 is similar to ESD testing structure 100. In comparison with ESD testing structure 100, ESD testing structure 900 includes a third die 960 above top die 112, such that top die 112 is between bottom die 114 and third die 960. ESD testing structure 900 is an exemplary structure resulting from bonding third die 960 to top die 112 in a 3DIC structure. In some embodiments, third die 960 physically contacts top die 112 to form an interface 910. In some embodiments, a standoff height exists between third die 960 and top die 112.

ESD testing structure 900 includes all the components of ESD testing structure 100. ESD testing structure 900 further includes a measurement device 920 in third die 960. Bonds 915 electrically connect third die 960 to top die 112. A fuse 930 is in top die 112. Probe pads A', B' and C' are similar to probe pads A, B, and C. Possible locations of probe pads A', B' and C' are similar to those discussed above with respect to probe pads A, B, and C; adjusted to refer to top die 112 and third die 960 instead of bottom die 114 and top die 112. Trimming pads TP1' and TP2' are similar to trimming pads TP1 and TP2. Possible locations of trimming pads TP1' and TP2' are similar to those discussed above with respect to trimming pads TP1 and TP2; adjusted to refer to top die 112 and third die 960 instead of bottom die 114 and top die 112. Components of ESD testing structure 900 are formed in a similar manner as that described above with respect to ESD testing structure 100.

ESD testing structure 900 is usable to measure an ESD event which occurs as a result of bonding third die 960 to top die 112. ESD testing structure 900 is capable is disabling measurement device 920 following bonding of top die 112 to bottom die 114, but prior to bonding third die 960 to top die 112.

In some embodiments, measurement device 120 has a same structure as measurement device 920. In some embodiments, measurement device 920 has a different structure from measurement device 120. In some embodiments, measurement device 120 is configured to measure a different electrical parameter, e.g., voltage or current, from measurement device 920. In some embodiments, measurement device 120 is configured to measure a same electrical parameter as measurement device 920.

Figure 9B:
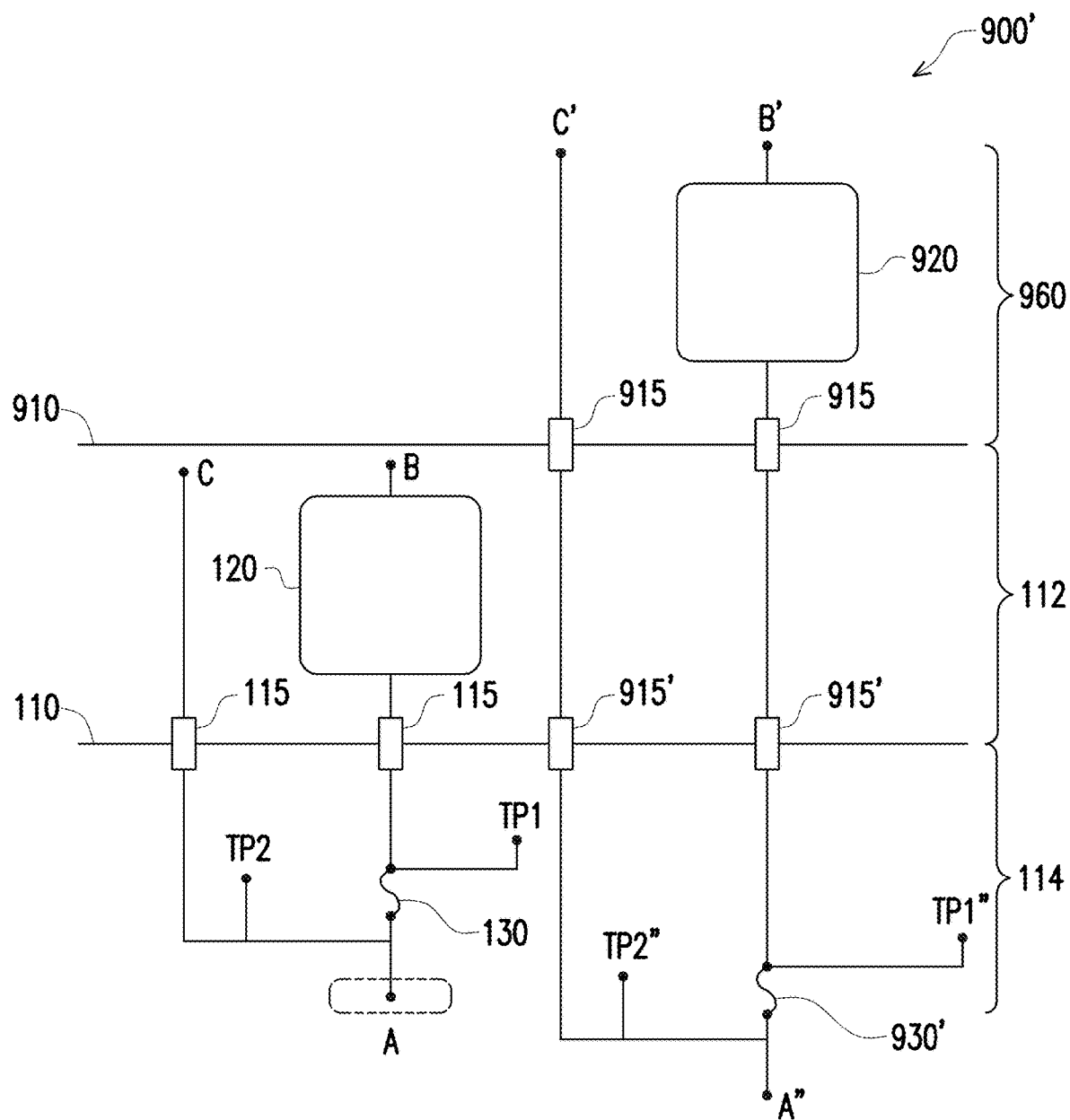

FIG. 9B is a cross-sectional view of an ESD testing structure 900' in accordance with some embodiments. ESD testing structure 900' is similar to ESD testing structure 900. In comparison with ESD testing structure 900, ESD testing structure 900' includes a fuse 930' and trimming pads TP1" and TP2" in bottom die 114 instead of top die 112. Electrical connections extend from bonds 915 through top die 112 to bonds 915' in order to electrically connect measurement device 920 to fuse 930'.

ESD testing structure 900' is capable of functioning in a similar manner as ESD testing structure 900 despite the location of fuse 930' in bottom die 114. The arrangement of ESD testing structure 900' is usable when an amount of free space in bottom die 114 is greater than an amount of free space in top die 112. For example, when bottom die 114 is fan out structure or an interposer, the amount of area of bottom die 114 occupied by functional elements is less than that in top die 112, in some embodiments.

Figure 10:
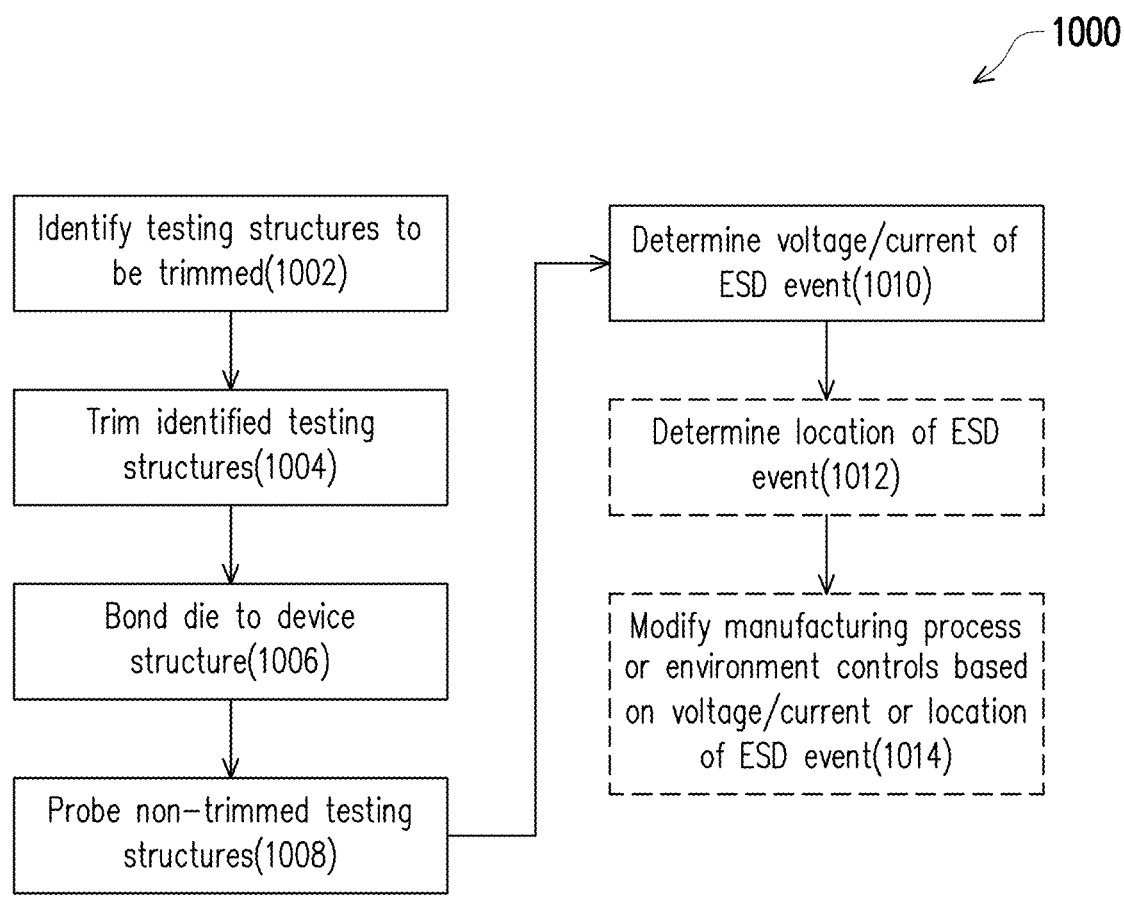
FIG. 10 is a flowchart of a method of using an ESD testing structure in accordance with some embodiments.

FIG. 10 is a flowchart of a method 1000 of using an ESD testing structure in accordance with some embodiments. In operation 1002, testing structures to be trimmed are identified. In some embodiments, the testing structures are identified based on a location of the testing structure on the die. In some embodiments, the testing structures are identified based on proximity to a functional component. In some embodiments, the testing structures are identified based on a type of electrical parameter measured. In some embodiments, the testing structures are identified automatically based on information available to a processor configured to identify testing structure based on any of the above criteria. In some embodiments, the testing structures are identified by a user.

In operation 1004, the identified testing structures are trimmed Trimming the testing structures includes disabling a measurement device of the testing structure. In some embodiments, trimming the identified testing structure includes blowing a fuse. In some embodiments, the fuse is blow by applying a sufficient voltage to trimming pads of the testing structure.

In operation 1006, a die is bonded to a device structure. The die includes functional components as well as a measurement device for measuring an ESD event during the bonding process. The measurement device is electrically connected to a fuse of the testing structure by the bonding process. In some embodiments, the bonding process includes a reflow process, a eutectic bonding process, a fusion bonding process or a hybrid bonding process. The measurement device is disabled by the trimming process in operation 1004 for all identified testing structures.

Measurement device which remain enabled following operation 1004 collect information related to any ESD event which occurs during the bonding process. In some embodiments, the measurement device captures a current or a voltage of the ESD event. In some embodiments, the die includes a plurality of measurement devices and the plurality of measurement devices provide information related to a location of the ESD event.

In some embodiments, the device structure includes another die, a substrate, an interposer, a fan-out structure or another suitable device. In some embodiments, the bonding process results in the die physically contacting the device structure. In some embodiments, the bonding process results in a standoff height between the die and the device structure.

In operation 1008, the non-trimmed testing structures are probed in order to retrieve information related to an ESD event during the bonding process. In some embodiments, probing the non-trimmed testing structures includes determining whether an open circuit remains following the bonding process. In some embodiments, probing the non-trimmed testing structure includes retrieving information related to a voltage of the ESD event. In some embodiments, probing the non-trimmed testing structure includes retrieving information related to a current of the ESD event. Other aspect and locations for the probing process are described above.

In operation 1010, a voltage and/or a current of the ESD event is determined. In some embodiments, the voltage is determined based on breaking down of a device having a known breakdown voltage. In some embodiments, the voltage is determined based on a voltage stored in a capacitor. In some embodiments, the current is determined based on a measurement of a resistance through an array of resistors and fuses. In some embodiments, determining the current of the ESD event includes determining a direction of the current. In some embodiments, determining the voltage and/or the current includes determine a possible range for the voltage and/or the current of the ESD event.

In optional operation 1012, a location of the ESD event is determined. The location of the ESD event is determined by comparing information retrieved from testing structures across the die. In some embodiments, operation 1012 is omitted. Operation 1012 is omitted if a location of the ESD event is unnecessary, in some instances.

In optional operation 1014, the voltage and/or the current of the ESD even is used to modify a manufacturing process or environmental controls. In some embodiments, the location information from operation 1012 is used to modify the manufacturing process or environmental controls.

The modification of the manufacturing process is used to reduce the accumulation or the location of charged particles on the die or the device structure in order to reduce a magnitude or location of an ESD event. In some embodiments, the manufacturing process is modified by adding a rinsing step to removed charged particles from the die or the device structure. In some embodiments, the manufacturing process is modified to change a grinding process or a dicing process. In some embodiments, the manufacturing process is modified by changing a material used during a cleaning process. In some embodiments, the manufacturing process is modified to alter a location of the ESD event by using magnetic forces to re-distribute charged particles within the die or the device structure.

The environmental controls are modified to help remove charged particles from an ambient environment of the manufacturing process. In some embodiments, modifying the environmental controls includes adjusting filters for the ambient air; providing additional static removal processes for operators entering the manufacturing area or other suitable environmental modifications.

In some embodiments, operation 1014 is omitted if the magnitude and location of the ESD event do not pose a risk of damaging the die or the device structure.

In some embodiments, an order of operations for method 1000 is changed. For example, in some embodiments, operation 1012 is performed prior to operation 1010. In some embodiments, additional operations are added. For example, in some embodiments, a passivation layer is formed over probe pads following operation 1008. In some embodiments, at least one operation is omitted. For example, in some embodiments, operation 1012 is omitted.

Method 1000 is usable with ESD testing structures described above or other suitable ESD testing structures. In some embodiments, several different structures or types of ESD testing structures are combined in order to implement method 1000.

Figure 11:
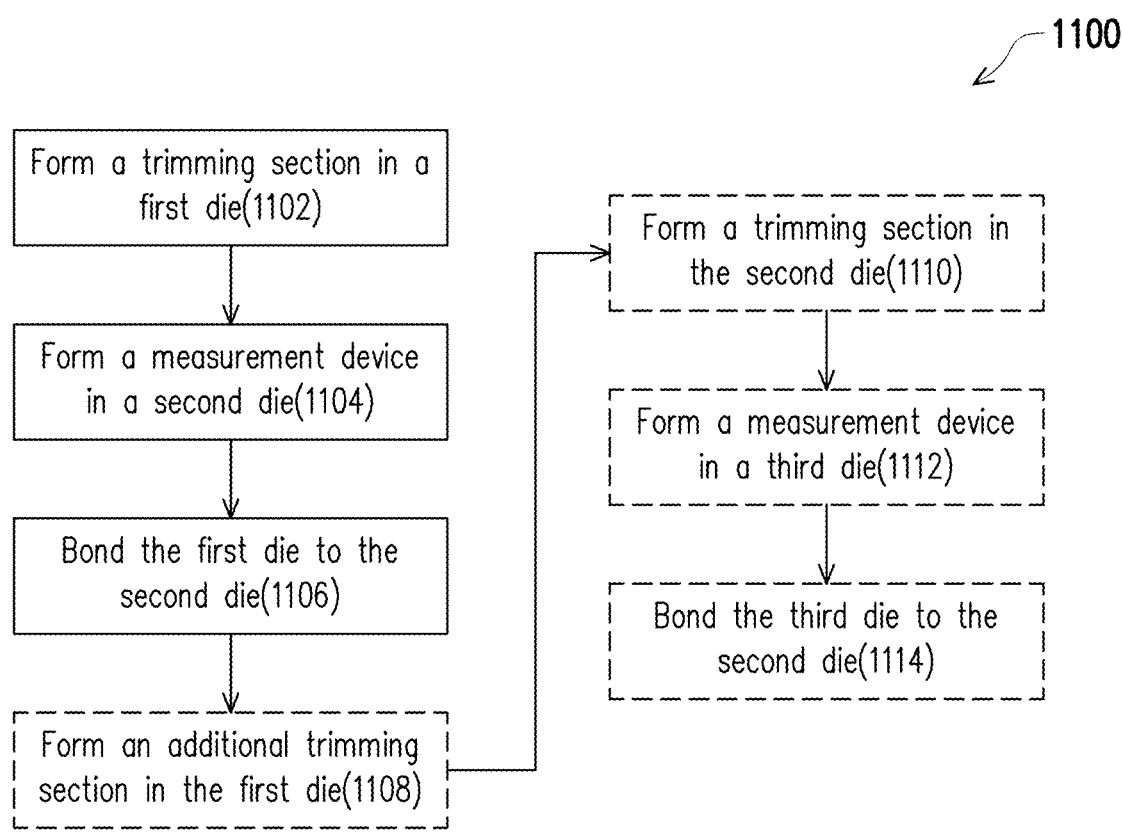
FIG. 11 is a flowchart of a method of making an ESD testing structure in accordance with some embodiments.

FIG. 11 is a flowchart of a method 1100 of forming an ESD testing structure in accordance with some embodiments. In operation 1102, a trimming section is formed in a first die. The trimming section includes a fuse electrically connected between two trimming pads, e.g., fuse 130 between trimming pads TP1 and TP2. In some embodiments, the fuse is formed in an interconnect structure of the first die. In some embodiments, forming the trimming section includes a photolithography process to form openings in the interconnect structure followed a deposition process to fill the openings with conductive material. In some embodiments, a planarization process or an etching process is used to remove excess conductive material following the deposition process. In some embodiments, the first die includes functional components. In some embodiments, the first die includes a substrate, an interposer, a fan-out structure or another suitable structure.

In operation 1104, a measurement device is formed in a second die. The second die includes functional components. In some embodiments, forming the measurement device includes forming a capacitor. In some embodiments, forming the measurement device includes forming at least one diode. In some embodiments, forming the measurement device also includes forming a current recording structure which includes an array of resistors and fuses. In some embodiments, forming the measurement device includes a series of implantation; deposition; photolithography; annealing or planarization processes. In some embodiments, forming the measurement device includes forming the measurement device in a front-end of the second die. In some embodiments, forming the measurement device includes forming at least a portion of the measurement device in an interconnect structure of the second die.

In operation 1106, the first die is bonded to the second die. Bonding the first die to the second die electrically connects the trimming section to the measurement device. In some embodiments, the bonding includes a reflow process, a eutectic bonding process, a fusion bonding process or a hybrid bonding process.

In optional operation 1108, an additional trimming section is formed in the first die. The additional trimming section is spaced away from the trimming section formed in operation 1102. The additional trimming section is formed in a location which is not covered by the second die in the bonding operation of 1106. In some embodiments, the additional trimming section is formed simultaneously with operation 1102. In some embodiments, the additional trimming section is formed before or after operation 1102. In some embodiments where no third die is bonded to the second die, operation 1108 is omitted. In some embodiments where method 1100 includes operation 1110, operation 1108 is omitted.

In optional operation 1110, a trimming section is formed in the second die. The trimming section is similar to the trimming section formed in operation 1102. In some embodiments, the trimming section is formed in an interconnect structure of the second die. In some embodiments, forming the trimming section includes a photolithography process to form openings in the interconnect structure followed a deposition process to fill the openings with conductive material. In some embodiments, a planarization process or an etching process is used to remove excess conductive material following the deposition process. In some embodiments where no third die is bonded to the second die, operation 1110 is omitted. In some embodiments where method 1100 includes operation 1108, operation 1110 is omitted.

In optional operation 1112, a measurement device is formed in a third die. The third die includes functional components. In some embodiments, forming the measurement device includes forming a capacitor. In some embodiments, forming the measurement device includes forming at least one diode. In some embodiments, forming the measurement device also includes forming a current recording structure which includes an array of resistors and fuses. In some embodiments, forming the measurement device includes a series of implantation; deposition; photolithography; annealing or planarization processes. In some embodiments, forming the measurement device includes forming the measurement device in a front-end of the third die. In some embodiments, forming the measurement device includes forming at least a portion of the measurement device in an interconnect structure of the third die. In some embodiments, the measurement device in the third die has a same structure as the measurement device in the second die. In some embodiments, the measurement device in the second die has a different structure from the measurement device in the third die. In some embodiments where no third die is bonded to the second die, operation 1112 is omitted.

In optional operation 1114, the third die is bonded to the second die. In some embodiments, bonding the third die to the second die electrically connects the trimming section in the first die to the measurement device in the third die. In some embodiments, bonding the third die to the second die electrically connects the trimming section in the second die to the measurement device in the third die. In some embodiments, the bonding includes a reflow process, a eutectic bonding process, a fusion bonding process or a hybrid bonding process. In some embodiments a bonding process in operation 1114 is a same bonding process as in operation 1106. In some embodiments, the bonding process in operation 1114 is a different bonding process from operation 1106.

In some embodiments where no third die is bonded to the second die, operation 1114 is omitted.

In some embodiments, an order of operations for method 1100 is changed. For example, in some embodiments, operation 1104 is performed prior to operation 1102. In some embodiments, additional operations are added. For example, in some embodiments, a passivation layer is formed over probe pads prior to operation 1114. In some embodiments, at least one operation is omitted. For example, in some embodiments, operation 1108 is omitted.

Method 1100 is usable to form ESD testing structures described above or other suitable ESD testing structures. In some embodiments, method 1100 is repeated to form several different structures or types of ESD testing structures in a same die in order to determine a location of an ESD event during a bonding process.

An aspect of this description relates to a method of making an electrostatic discharge (ESD) testing structure. The method includes forming, in a first die, a first measurement device. The method further includes forming, in a second die, a fuse, a first trim pad, and a second trim pad. The method further includes forming, between the first die and the second die, a plurality of electrical bonds, wherein a first bond of the plurality of bonds is electrically connected to the first trim pad and a first side of the fuse, and a second bond of the plurality of bonds is electrically connected to the second trim pad and a second side of the fuse. In some embodiments, forming the plurality of electrical bonds includes bonding the first die to the second die. In some embodiments, forming the plurality of electrical bonds includes bonding the first die to a third die, wherein the third die is between the first die and the second die. In some embodiments, the method further includes forming a second measurement device in the third die. In some embodiments, forming the second measurement device includes forming the second measurement device for measuring an electrical parameter different from that measurable using the first measurement device. In some embodiments, forming the first measurement device includes forming a voltage measurement device. In some embodiments, forming the first measurement device includes forming a current measurement device. In some embodiments, the method further includes forming, in the first die, a second measurement device different from the first measurement device.

An aspect of this description relates to a method of making an electrostatic discharge (ESD) testing structure. The method includes forming, in a first die, a first measurement device. The method further includes forming, in a device structure, a first fuse. The method further includes forming, in a second die, a second measurement device. The method further includes forming, outside of the second die, a second fuse. The method further includes forming a first plurality of bonds to electrically connect the first die to the device structure, and the first fuse to the first measurement device. The method further includes forming a second plurality of bonds electrically connecting the second die to the first die, wherein a first bond of the second plurality of bonds connects the second measurement device to the second fuse. In some embodiments, forming the second fuse includes forming the second fuse in the device structure. In some embodiments, forming the second fuse includes forming the second fuse in the first die. In some embodiments, forming the first plurality of bonds includes forming a first bond of the first plurality of bonds electrically connected to a first trim pad in the device structure and to the first fuse. In some embodiments, forming the second plurality of bonds includes forming a first bond of the second plurality of bonds electrically connected to a first trim pad outside the second die and to the second fuse. In some embodiments, forming the second measurement device includes forming the second measurement device for measuring an electrical parameter different from that measurable using the first measurement device. In some embodiments, forming the first plurality of bonds includes forming each of the first plurality of bonds comprising a copper pillar or a sold bump.

An aspect of this description relates to method of making an electrostatic discharge (ESD) testing structure. The method includes forming, in a first die, a first measurement device. The method further includes forming, in a second die, a second measurement device. The method further includes forming, outside of the second die, a first fuse and a second fuse. The method further includes bonding, using a first plurality of bonds, the first die to a device structure, wherein bonding the first die to the device structure comprises electrically connecting the first fuse to the first measurement device. The method further includes bonding, using a second plurality of bonds, the second die to the first die, wherein bonding the second die to the first die comprises electrically connecting the second measurement device to the second fuse. In some embodiments, forming the first fuse includes forming the first fuse in a same die as the second fuse. In some embodiments, forming the first fuse includes forming the first fuse in a different die from the second fuse. In some embodiments, forming the second fuse includes forming the second fuse in the first die. In some embodiments, bonding the second die to the first die includes fusion bonding the second die to the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making electrostatic discharge (ESD) testing structures, comprising:
   forming, in a first integrated circuit in a first die, a first type of ESD testing structure having a first type of measurement device, wherein the first integrated circuit is at a first location in a first pattern of integrated circuits in the first die;
   forming, in a second integrated circuit in the first die, a second type of ESD testing structure different from the first type of ESD testing structure, wherein the second type of ESD testing structure has a second type of measurement device, and the second integrated circuit is at a second location in a second pattern of integrated circuits in the first die, the first pattern of integrated circuits and the second pattern of integrated circuits incompletely covering a distribution of integrated circuits in the first die;
   forming, in a second die, for each of the first type of ESD testing structure and each of the second type of ESD testing structure, a fuse electrically connected to a plurality of trim pads; and
   forming, between the first die and the second die, a plurality of electrical bonds, wherein for each type of ESD testing structure, a first bond electrically connects a type measurement device of the ESD testing structure to a fuse of the plurality of fuses and to at least two trim pads of the plurality of trim pads electrically connected to the fuse.

2. The method of claim 1, wherein forming the first type of ESD testing structure further comprises randomly selecting locations for the first pattern of integrated circuits.

3. The method of claim 2, wherein forming the second type of ESD testing structure further comprises randomly selecting locations for the second pattern of integrated circuits.

4. The method of claim 1, wherein a combination of the first pattern of integrated circuits and the second pattern of integrated circuits completely covers a distribution of locations of integrated circuits in the first die.

5. The method of claim 1, wherein forming the first type of ESD testing structure further comprises selecting locations for the first pattern of integrated circuits based on locations of integrated circuit damage.

6. The method of claim 1, wherein forming the first pattern of integrated circuits further comprises generating a local pattern of measurement devices and repeating the local pattern of measurement across the first die.

7. An ESD testing array, comprising:
   a first set of measurement devices in a first die at a first set of locations;
   a second set of measurement devices in the first die at a second set of locations, wherein the first set of locations and the second set of locations include different locations;
   a fuse, wherein
      a first end of the fuse electrically connects to a first end of a measurement device of the first set of measurement devices, and
      a second end of the fuse electrically connects to a first probe pad;
   a second probe pad electrically connected to a second end of the measurement device of the first set of measurement devices;
   a first bond electrically connected to
      the first end of the fuse, and
      the first end of a first measurement device of the first set of measurement devices; and
   a second bond electrically connected to
      the second end of the fuse, and
      the second probe pad.

8. The ESD testing array of claim 7, wherein each of the first set of measurement devices is configured to measure voltage and each of the second set of measurement devices is configured to measure current.

9. The ESD testing array of claim 8, wherein each location of the first set of locations is surrounded by eight locations of the second set of locations.

10. The ESD testing array of claim 8, wherein a first location of the first set of locations is surrounded by 4 locations of the second set of locations.

11. The ESD testing array of claim 8, wherein a first location of the first set of locations is between two locations of the second set of locations.

12. The ESD testing array of claim 7, wherein the first set of locations and the second set of locations are collectively arranged in a grid pattern.

13. The ESD testing array of claim 7, wherein the first set of locations is arranged in a first line.

14. The ESD testing array of claim 13, wherein the second set of locations is arranged in a second line adjacent to the first line.

15. The ESD testing array of claim 13, wherein the second set of locations is collectively arranged in a second line perpendicular to the first line.

16. An electrostatic discharge (ESD) test array, comprising
- a first set of ESD testing structures in a first die, the first set of ESD testing structures including a first group of ESD testing structures having a first type of measurement device, and a second group of ESD testing structures having a second type of measurement device, in an alternating pattern in the first set of ESD testing structures, wherein each ESD testing structure of the first set of ESD testing structures includes:
  - a measurement device in the first die,
  - a fuse,
  - a first trim pad, wherein the first trim pad is electrically connected to a first end of the fuse and
  - a second trim pad in a second die, wherein the second trim pad is electrically connected to a second end of the fuse.

17. The ESD test array of claim 16, wherein the first group of ESD testing structures and the second group of ESD testing structures have a same type of measurement device.

18. The ESD test array of claim 16, wherein the first group of ESD testing structures and the second group of ESD testing structures have different types of measurement devices.

19. The ESD test array of claim 17, further comprising a second set of ESD testing structures including a third group of ESD testing structures, and a fourth group of ESD testing structures in the alternating pattern of the first set of ESD testing structures, wherein the first set of ESD testing structures is arranged in a first line, and wherein the second set of ESD testing structures is arranged in a second line.

20. The ESD test array of claim 18, wherein the first line is perpendicular to the second line.

* * * * *